(12) United States Patent
Muschallik et al.

(10) Patent No.: US 6,636,727 B2
(45) Date of Patent: Oct. 21, 2003

(54) PHASE LOCKED LOOP SYSTEM

(75) Inventors: Claus Muschallik, München (DE);
Bernd Pflaum, Unterhaching (DE);
Heinz Lang, München (DE)

(73) Assignee: Infineon Technologies, Munich (DE)

( * ) Notice: Subject to any disclaimer, the term of this patent is extended or adjusted under 35 U.S.C. 154(b) by 177 days.

(21) Appl. No.: 09/793,340

(22) Filed: Feb. 26, 2001

(65) Prior Publication Data

US 2001/0027092 A1 Oct. 4, 2001

Related U.S. Application Data

(63) Continuation of application No. PCT/DE00/02066, filed on Jun. 26, 2000.

(30) Foreign Application Priority Data

Jun. 25, 1999 (DE) .......................... 199 29 178

(51) Int. Cl.[7] .............................. H04B 1/06; H03D 3/24
(52) U.S. Cl. ..................... 455/260; 455/76; 455/343; 455/264; 375/376
(58) Field of Search ............................ 455/260, 266, 455/264, 265, 313, 130, 113, 119, 343, 76, 258, 259, 267, 77; 375/327, 376; 331/327; 327/148, 159

(56) References Cited

U.S. PATENT DOCUMENTS

| | | | |
|---|---|---|---|
| 5,103,192 A | * 4/1992 | Sekine et al. ............... | 455/343 |
| 5,184,091 A | * 2/1993 | Srivastava ................... | 331/10 |
| 5,271,040 A | * 12/1993 | Clark ......................... | 375/327 |
| 5,339,050 A | 8/1994 | Llewellyn | |
| 5,408,202 A | 4/1995 | Shirazi et al. | |
| 5,631,587 A | * 5/1997 | Co et al. .................... | 455/260 |
| 5,794,130 A | * 8/1998 | Abe et al. ................... | 455/260 |
| 6,178,216 B1 | * 1/2001 | Lee ............................ | 375/376 |

FOREIGN PATENT DOCUMENTS

| | | |
|---|---|---|
| DE | 196 39 237 A1 | 3/1997 |
| EP | 0 755 120 A1 | 1/1997 |
| JP | 09/232950 A | 9/1997 |
| JP | 11-122101 A | 4/1999 |

OTHER PUBLICATIONS

"Influence of RF Oscillators on an OFDM Signal" (Muschallik et al.), IEEE Transactions on Consumer Electronics, vol. 41, No. 3, Aug. 1995, pp. 592–603.

* cited by examiner

Primary Examiner—Vivian Chin
Assistant Examiner—John J Lee
(74) Attorney, Agent, or Firm—Laurence A. Greenberg; Werner H. Stemer; Ralph E. Locher

(57) ABSTRACT

A phase locked loop system for tuning the reception frequency of a receiver for digitally modulated received signals and analog-modulated received signals has at least one voltage controlled oscillator for producing an oscillator signal for a reception frequency tuning. A first frequency divider is provided for dividing the frequency of the oscillator signal to a nominal comparison frequency as a function of a receiving channel selection signal. A second frequency divider is provided for dividing a reference frequency as a function of a reception mode switching signal. A phase comparison circuit is provided for comparing the signals supplied by the frequency dividers in order to produce a tuning voltage for the voltage controlled oscillator wherein the gain of the phase comparison circuit is adjustable in order to optimize the phase noise.

17 Claims, 9 Drawing Sheets

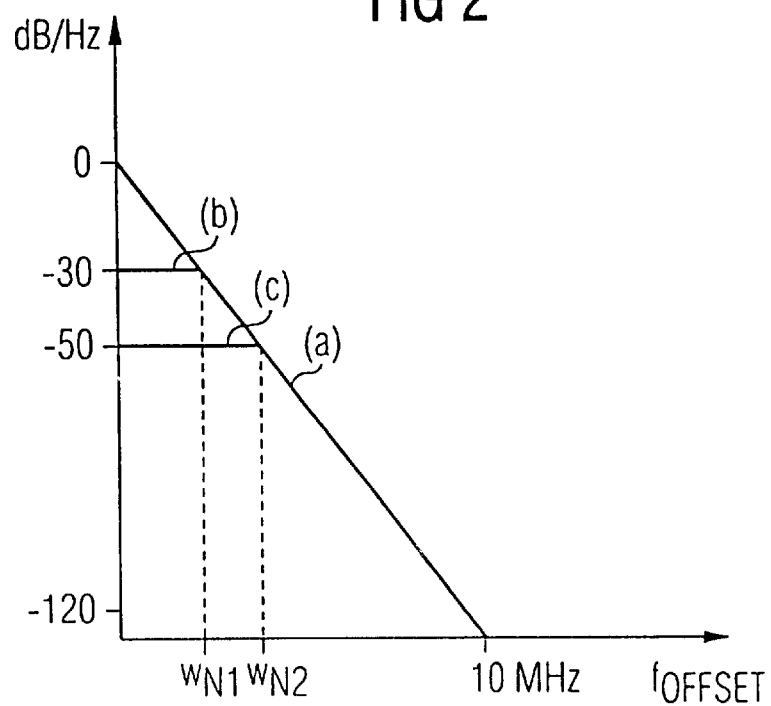
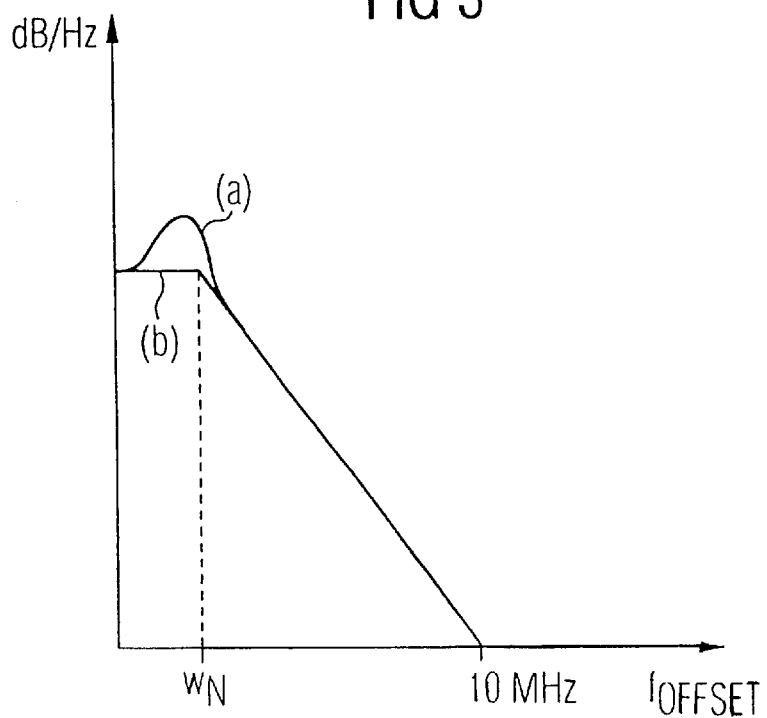

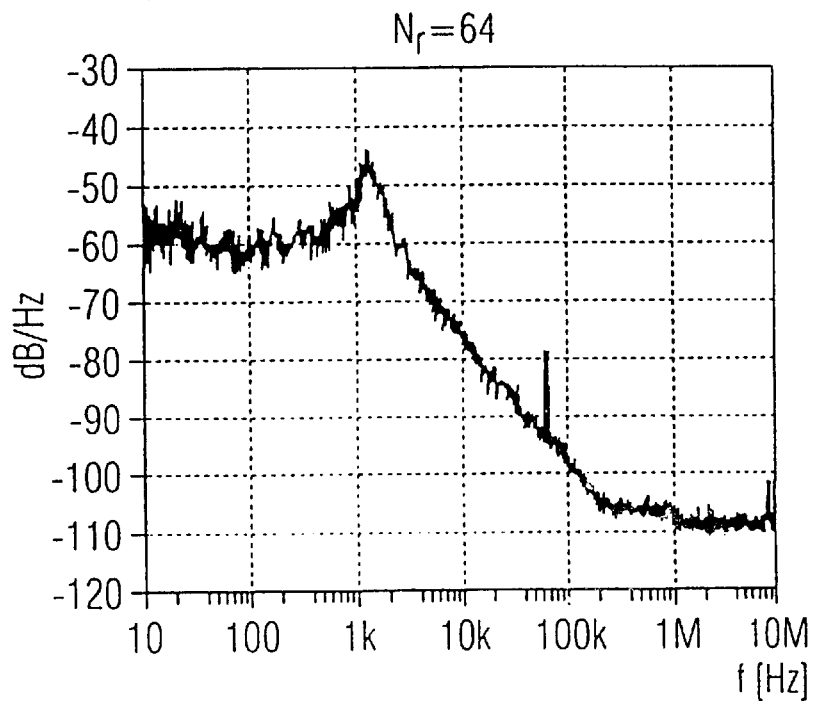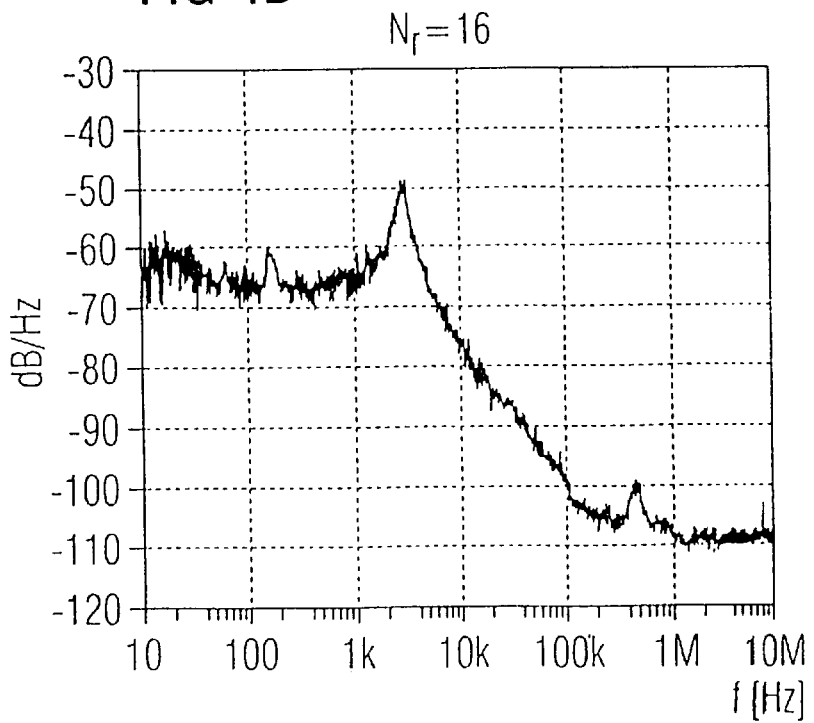

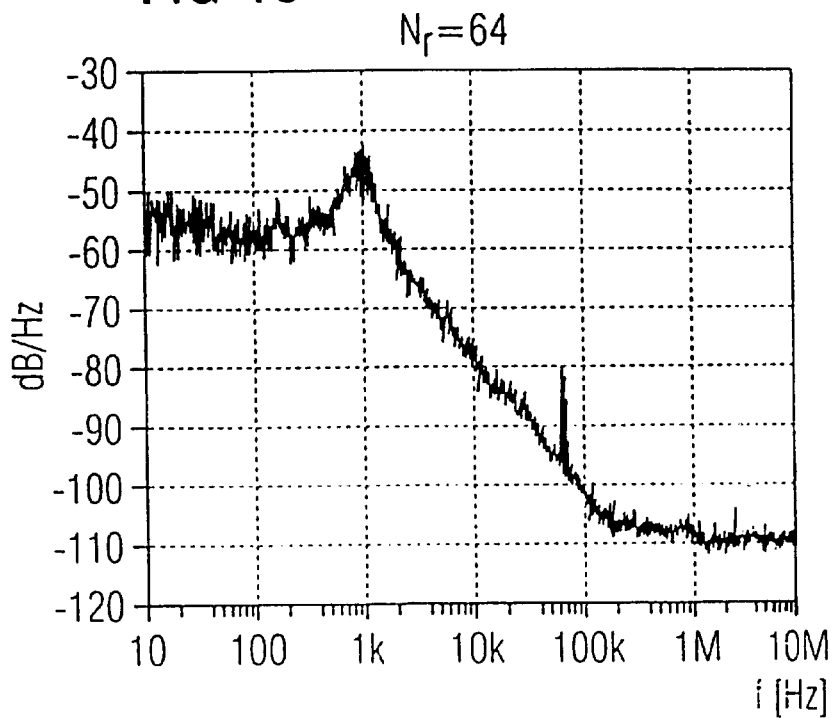
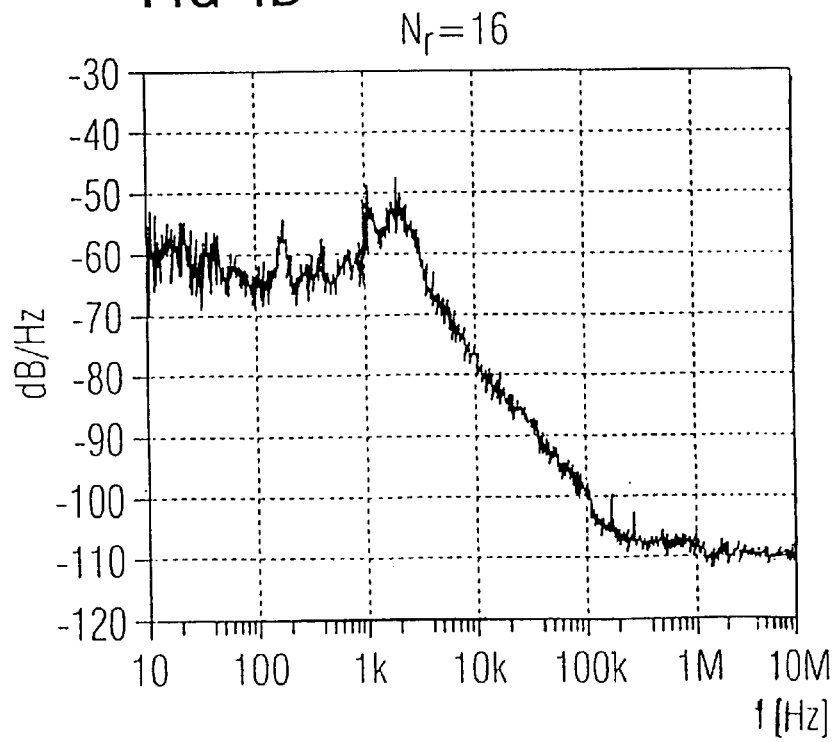

PHASE LOCKED LOOP SYSTEM

CROSS-REFERENCE TO RELATED APPLICATION

This application is a continuation of copending International Application No. PCT/DE00/02066, filed Jun. 26, 2000, which designated the United States.

BACKGROUND OF THE INVENTION

FIELD OF THE INVENTION

The invention relates to a phase locked loop system for tuning a reception frequency of a receiver for digitally modulated received signals and analog-modulated received signals such that the phase noise is minimized.

Digital television distribution services (DVB: Digital Video Broadcasting) are transmitted using an OFDM multiplexing method (OFDM: Orthogonal Frequency Division Multiplexing). The DVB transmission standard includes, inter alia, methods for a digital modulation for satellites and cable television dissemination, as well as for terrestrial dissemination, systems for video text and program information, and also for signal encryption. The OFDM multiplexing method is particularly suitable for a terrestrial distribution of digital broadcast signals which are subject to severe interference. The OFDM multiplexing method is particularly insensitive to signal echoes.

Since the signal information is coded in the signal phase in the OFDM multiplexing method, an OFDM signal receiver is particularly sensitive to phase noise and phase fluctuations. This is particularly due to the fact that the digital demodulator for OFDM demodulation is unable to compensate for phase noise which occurs above offset frequencies of 10 to 100 Hz. Conventional receivers for reception and demodulation of analog-modulated received signals are less sensitive to phase noise.

Broadcast received signals, in particular television received signals, are increasingly transmitted with digital modulation. Digital television started in Germany in summer 1996 with the pay-TV transmitter DF1. In addition to this, broadcast signals, in particular television signals, still continue to be transmitted with analog modulation. U.S. Pat. No. 5,408,202 discloses a phase locked loop having a voltage controlled oscillator, an adjustable frequency divider, a reference oscillator, a phase comparator and a loop filter. The gain of the phase comparison circuit can be adjusted via a drive circuit. The noise response is optimized as a function of the setting of the loop gain.

U.S. Pat. No. 5,631,587 discloses a frequency synthesizer with an adjustable loop bandwidth. The loop gain can be adjusted by controlling the charging current of the charge pump.

Patent Abstracts of Japan No. JP-A-11 122101 describes a phase locked loop which has a frequency divider in the feedback path as well as a reference frequency divider, with an adjustable amplifier being provided in order to improve the noise response.

Patent Abstracts of Japan No. JP-A-09 232950 discloses a PLL (Phase Locked Loop) circuit whose loop gain can be adjusted by controlling the charging current of a charge pump.

SUMMARY OF THE INVENTION

It is accordingly an object of the invention to provide a phase locked loop system which overcomes the above-mentioned disadvantages of the heretofore-known systems of this general type and in which the phase noise response is optimized.

With the foregoing and other objects in view there is provided, in accordance with the invention, a phase locked loop system for tuning a reception frequency of a receiver which receives digitally modulated signals and analog-modulated signals, the phase locked loop system includes:

at least one voltage controlled oscillator for producing an oscillator signal having an oscillator signal frequency, the oscillator signal being provided for tuning a reception frequency;

a first frequency divider, coupled to the at least one voltage controlled oscillator, for dividing the oscillator signal frequency to a nominal comparison frequency as a function of a receiving channel selection signal;

a reference oscillator for generating a reference oscillator signal having a given reference frequency;

a second frequency divider, coupled to the reference oscillator, for dividing the given reference frequency as a function of a reception mode switching signal;

a phase comparison circuit, coupled to the first frequency divider and to the second frequency divider, for comparing signals supplied by the first frequency divider and the second frequency divider in order to produce a tuning voltage for the at least one voltage-controlled oscillator, the phase comparison circuit having an adjustable gain for optimizing a phase noise;

a multiplication device, coupled to the at least one voltage controlled oscillator, for multiplying a received signal by the oscillator signal in order to produce an intermediate frequency signal; and a detection circuit provided downstream from the multiplication device, the detection circuit detecting the phase noise on the intermediate frequency signal and generating a control signal, the adjustable gain of the phase comparison circuit being adjustable as a function of the control signal.

One advantage of the phase locked loop system according to the invention is that it is suitable for reception not only of digitally modulated broadcast received signals, but also of analog-modulated broadcast received signals.

According to the invention, a phase locked loop system for tuning the reception frequency of a receiver for digitally and analog-modulated received signals is provided, having at least one voltage controlled oscillator for producing an oscillator signal for reception frequency tuning, a first frequency divider for dividing the frequency of the oscillator signal to a nominal comparison frequency as a function of a receiving channel selection signal, a reference oscillator for emitting a reference oscillator signal at a specific reference frequency, a second frequency divider for dividing the reference frequency as a function of a reception mode switching signal, a phase comparison circuit for comparing the signals emitted from the frequency dividers in order to produce a tuning voltage for the voltage controlled oscillator, with the gain of the phase comparison circuit being adjustable in order to optimize the phase noise, in which case, the received signal can be multiplied through the use of a multiplication device by the oscillator signal in order to produce an intermediate frequency signal, the multiplication device has a phase noise detection circuit connected downstream from it in order to detect the phase noise on the intermediate frequency signal, and the gain of the phase comparison circuit is adjustable as a function of the control signal which is produced by the phase noise detection circuit.

In a preferred embodiment of the phase locked loop system according to the invention, the phase comparison circuit includes a phase comparator and a charge pump, with the gain of the phase comparison circuit being adjustable through the use of a charging current which is produced by the charge pump.

The mixer device or multiplication device preferably has an automatic gain control circuit connected downstream from it, which amplifies the received signal as a function of the amplitude of the intermediate frequency signal.

In a further advantageous embodiment of the phase locked loop system according to the invention, the charging current which is supplied by the charge pump is adjusted as a function of a control signal which is produced by a controller connected to the charge pump.

In a further advantageous embodiment of the phase locked loop system according to the invention, the first frequency divider can be switched between a plurality of frequency division ratios as a function of the receiving channel selection signal, with a frequency division ratio for receiving an analog-modulated and a digitally modulated received signal being stored, for each receiving channel which can be selected, in a memory.

In a further advantageous embodiment of the phase locked loop system according to the invention, the second frequency divider can be switched between a first frequency division ratio for an analog-modulated received signal and a second frequency division ratio for a digitally modulated received signal through the use of a switching device.

In a further advantageous embodiment of the phase locked loop system according to the invention, the tuning voltage is filtered by a loop filter.

The multiplication device preferably has at least one signal amplifier and a surface acoustic wave (SAW) signal bandpass filter connected downstream from it.

In a further advantageous embodiment of the phase locked loop system according to the invention, the reference oscillator is a quartz crystal.

The first frequency divider in the phase locked loop system according to the invention is preferably connected to a receiving channel selection device for producing the receiving channel selection signal.

In a preferred embodiment of the phase locked loop system according to the invention, the multiplication device has a phase noise detection circuit connected downstream from it, in order to detect the phase noise of the intermediate frequency signal.

The gain of the phase comparison circuit, in a preferred embodiment, is adjustable as a function of a control signal which is produced by the phase noise detection circuit.

This offers the particular advantage that the phase noise is automatically minimized as a function of the phase noise detected in the intermediate frequency signal.

According to another feature of the invention, an automatic gain control circuit is provided downstream from the multiplication device for amplifying the received signal as a function of an amplitude of the intermediate frequency signal.

According to another feature of the invention, a loop filter is coupled to the phase comparison circuit for filtering the tuning voltage produced by the phase comparison circuit.

According to yet another feature of the invention, at least one signal amplifier and a SAW bandpass filter are provided downstream of the multiplication device.

In a further preferred embodiment of the phase locked loop system according to the invention, the nominal comparison frequency is 62.5 kHz for analog-modulated received signals, and 166.7 kHz for digitally modulated received signals.

In an alternative embodiment of the phase locked loop system according to the invention, the nominal comparison frequency is 62.5 kHz for analog-modulated received signals, and 250 kHz for digitally modulated received signals.

The reference oscillator preferably produces a reference oscillator signal at a frequency of 4 MHz.

The second frequency divider can preferably be switched between a frequency division ratio of 64 for an analog-modulated received signal, and a frequency division ratio of 24 for a digitally modulated received signal.

In an alternative embodiment of the phase locked loop system according to the invention, the second frequency divider can be switched between a frequency division ratio of 64 for an analog-modulated received signal, and a frequency division ratio of 16 for a digitally modulated received signal.

In a preferred embodiment, the phase locked loop system according to the invention has a modulation type identification circuit which identifies whether the received signal is digitally modulated or analog-modulated.

The modulation type identification circuit preferably controls the switching device to switch the second frequency divider between the first frequency division ratio for an analog-modulated received signal, and the frequency division ratio for a digitally modulated received signal.

This offers the particular advantage that the switching of the frequency division ratio takes place automatically as a function of the identified modulation type.

Other features which are considered as characteristic for the invention are set forth in the appended claims.

Although the invention is illustrated and described herein as embodied in a phase locked loop system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a graph of the frequency profile of the phase noise in a receiver according to the prior art and in a receiver in which the phase locked loop system according to the invention is used;

FIG. 3 is a graph for illustrating the frequency profile of the phase noise in a receiver according to the prior art, and in a receiver in which the phase locked loop system according to the invention is used;

FIGS. 4A to 4F are graphs for illustrating the phase noise as a function of the frequency at different received-carrier mid-frequencies and different frequency division ratios for reception of an analog-modulated received signal and a digitally modulated received signal;

DESCRIPTION OF THE PREFERRED EMBODIMENTS

Figure 1:
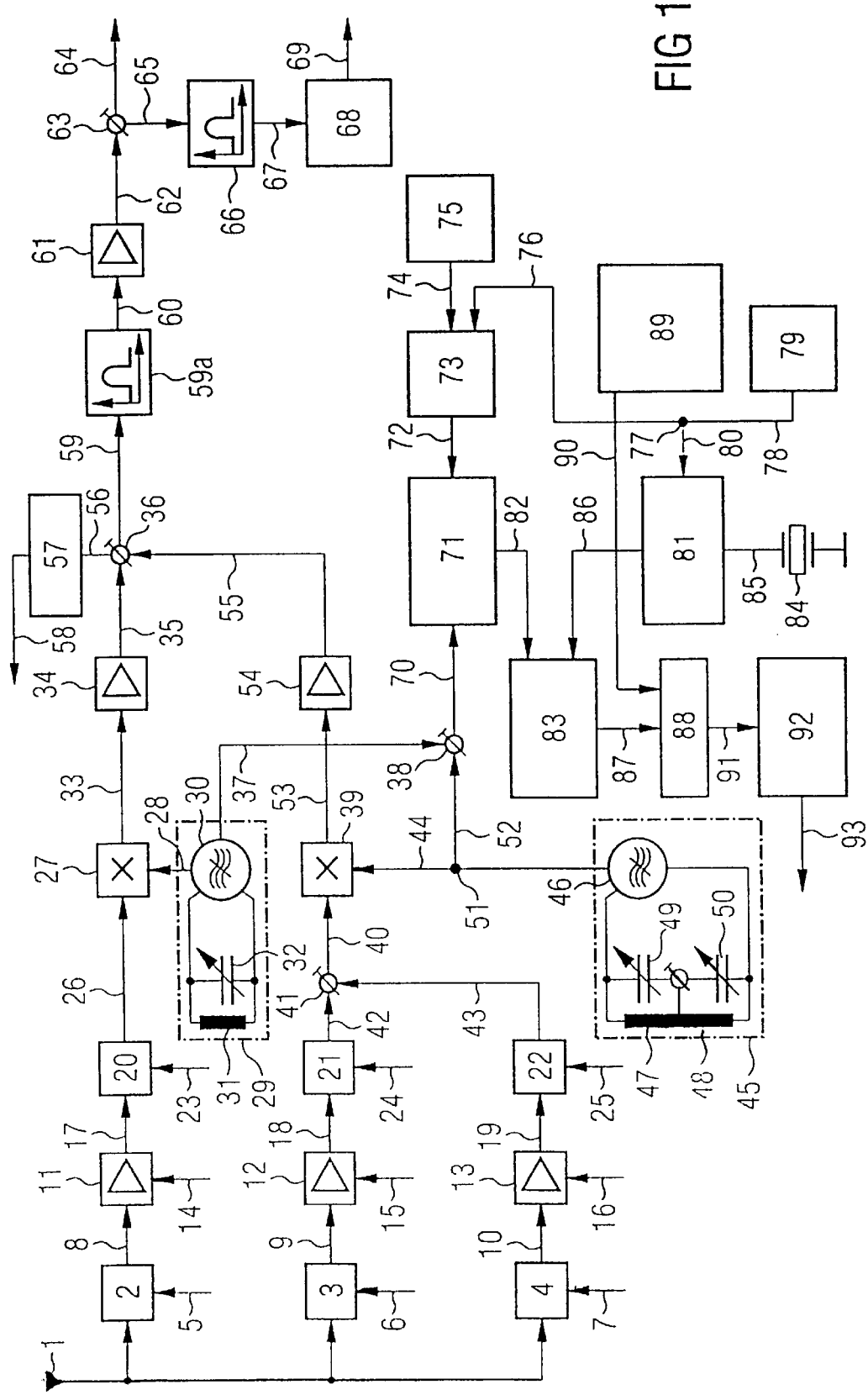
FIG. 1 is a block diagram of a preferred embodiment of the phase locked loop system according to the invention.

Referring now to the figures of the drawings in detail and first, particularly, to FIG. 1 thereof, there is shown a detail of a receiver for reception of digitally and/or analog-modulated broadcast received signals, in particular television signals, in which the phase locked loop system according to the invention is used.

The broadcast receiver has an antenna 1 through the use of which digitally or analog-modulated broadcast received signals, for example television signals, are received. Broadcast received signals are preferably in a band from 0 to 900 MHz. The received broadcast signal is supplied in parallel to three different adjustable bandpass filters 2, 3, 4. The frequency passbands of the bandpass filters 2, 3, 4 can preferably be adjusted through the use of an adjusting voltage via control lines 5, 6, 7. The bandpass filters 2, 3, 4 selectively filter out all those received signals which are not within the respectively set reception frequency bands. The adjustable reception frequency bands are preferably the VHF reception frequency bands (VHF: Very High Frequency or ultrashort wave) and the UHF reception frequency band (UHF: Ultra High Frequency).

The respectively filtered received signals are passed via signal lines 8, 9, 10 to signal amplifiers 11, 12, 13. The gain from the signal amplifiers 11, 12, 13 can preferably be adjusted via respective gain adjustment lines 14, 15, 16. On the output side, the signal amplifiers 11, 12, 13 are connected via lines 17, 18, 19 to further adjustable bandpass filters 20, 21, 22. The frequency passbands of the bandpass filters 20, 21, 22 can preferably be adjusted via respective adjustment lines 23, 24, 25. The frequency passbands of the bandpass filters 20, 21, 22 preferably respectively correspond to the frequency passbands of the bandpass filters 2, 3, 4.

In the preferred embodiment illustrated in FIG. 1, the reception frequency passband of the bandpass filters 2, 20 is the VHFI reception frequency band. The reception frequency passband of the bandpass filters 3, 21 is the VHFII reception frequency band, and the reception frequency passband of the bandpass filters 4, 22 is preferably the UHF reception frequency band. The output line 26 from the bandpass filter 20 carries the filtered received signal in the VHF reception frequency band to a mixer or multiplication device 27. The multiplication device 27 multiples the filtered received signal by an oscillator signal supplied via a line 28. The oscillator signal is produced by a first oscillator 29, which contains an amplifier 30 and a frequency-dependent feedback network, with the frequency-dependent feedback network of the oscillator circuit 29 illustrated in FIG. 1 including a coil 31 and a capacitance 32 connected in parallel with it. The capacitance 32 can preferably be adjusted through the use of a tuning voltage, and is formed by a varactor diode. On the output side, the mixing device 27 is connected via a line 33 to a signal amplifier 34. An intermediate frequency signal, which is at an intermediate frequency, is produced by multiplication of the filtered received signal present on the line 26 by the oscillator signal present on the line 28. The intermediate frequency is formed by the difference between the oscillator signal frequency and the received frequency. The intermediate frequency signal supplied by the line 33 is amplified by the signal amplification device 34, and is supplied via a line 35 to a node 36. The voltage controlled oscillator 29 for producing the oscillator signal furthermore supplies the oscillator signal via a line 37 to a node 38.

The receiver illustrated in FIG. 1 contains a second mixer or second multiplication device 39. The multiplication device 39 is connected via an input line 40 to a sum node 41. The sum node 41 is connected via a line 42 to the output of the bandpass filter 21, and via a line 43 to the output of the bandpass filter 22. The multiplication device 39 multiplies the filtered radio-frequency received signal present on the input line by an oscillator signal which is present on a line 44 and is produced by a voltage controlled oscillator 45. In the exemplary embodiment shown in FIG. 1, the oscillator 45 contains an amplifier device 46 which is connected to a frequency-dependent feedback network. The feedback network in the illustrated example includes two tuned circuits or resonant circuits. The two tuned circuits respectively include a coil 47, 48 and a capacitance 49, 50 connected in parallel with it. The capacitances are in this case adjustable. The variable capacitances in the tuned circuits are preferably formed by voltage-controlled varactor diodes. Two oscillator signals at different oscillator frequencies can be produced by the voltage controlled oscillator 45. In this case, the first oscillator frequency is used for multiplication by received signals which are in the frequency passband of the bandpass filters 3, 21 while, in contrast, the second oscillator mixing signal produced by the oscillator 45 is used for multiplication by those received signals which are in the frequency passband of the bandpass filters 4, 22. The oscillator signal formed by the oscillator 45 is tapped off at the node 51 and is supplied via a line 52 to the node 38. The mixing device 39 multiplies the radio-frequency filtered received signal present on the input line 40 by the oscillator signal present on the line 44 in order to produce an intermediate frequency signal which is passed via an output line 53 of the multiplication device 39 to a signal input of a signal amplifier 54. The signal amplifier 54 amplifies the received intermediate frequency signal, and supplies it via an output line 55 to the node 36.

A gain control circuit 57 is connected via a line 56 to the node 36 and adjusts the signal gain of the amplifiers 11, 12, 13, via a control line 58, as a function of the amplitude of the intermediate frequency signals present at the node 36. The control line 58 is preferably connected to the control lines 14, 15, 16. The gain control circuit 57 controls the gain of the amplifiers 11, 12, 13 in such a way that the amplitude of the intermediate frequency signal at the node 36 is as constant as possible at a desired signal level.

The intermediate frequency signal present at the node 36 is supplied via a line 59 to a SAW bandpass filter 59a, whose filtered output signal emitted via an output line 60 is amplified by a downstream signal amplifier 61 before being applied via a line 62 to an output node 63. If the received signal is an analog-modulated broadcast signal, this is passed on via a line 64 for further signal processing.

In a preferred embodiment, the intermediate frequency of the intermediate frequency signal present at the node 63 is 36 MHz. The intermediate frequency signal present at the node is supplied via a line 65 to a further SAW bandpass filter 66, which is connected on the output side via a line 67 to a mixing amplification device 68. The mixing amplification device 68 mixes the received filtered signal in such a way that the frequency is reduced from 36 MHz to 7 MHz, with the signal amplitude at the same time being amplified. The signal emitted from the mixing amplification device 68 is supplied as a digitally modulated intermediate frequency signal via a line 69 for a further signal processing.

The output oscillator signals (which are present at the node 38) from the voltage controlled oscillators 29, 45 are supplied via a line 70 to a frequency divider 71, which divides the frequency of the applied oscillator signals to a nominal comparison frequency as a function of a control signal which is read via a line 72 from a memory device 73. A large number of frequency division ratios are stored in the memory device 73. The memory device 73 receives a receiving channel selection signal from a receiving channel selection device 75 via a selection line 74. An operator or a program can select a desired receiving channel via the receiving channel selection device 75. The memory device 73 is furthermore connected via a line 76 to a node 77, to which a switching device 79 is connected via a line 78. The frequency divider 71 is programmable and can be switched between a large number of frequency division ratios, which are stored in tabular form in the memory device 73. A respective frequency division ratio for an analog-modulated received signal and a digitally modulated received signal is stored for each receiving channel selected via the receiving channel selection device 75.

The switching device 79 switches a further programmable frequency divider 81, via a line 80, between a first frequency division ratio for an analog-modulated received signal, and a second frequency division ratio for a digitally modulated received signal.

The frequency divider 71 divides the oscillator signal which is received via the line 70 and is produced through the use of the oscillators 29, 45 by the first frequency division ratio read from the memory device 73 via the line 72, and emits the signal, whose frequency has been divided, via a line 82 to a phase or frequency comparator 83.

A reference oscillator 84 produces a reference oscillator signal, which is applied via a line 85 to the frequency divider 81. The frequency divider 81 divides the frequency of the applied reference oscillator signal by a frequency ratio which can be switched by the switching device 79. The switching device 79 switches the frequency division ratio of the frequency divider 81 between a first frequency division ratio for an analog-modulated received signal, and a second frequency division ratio for a digitally modulated received signal. The reference oscillator signal, divided by the set frequency division ratio, is likewise supplied from the frequency divider 81 via an output line 86 to the phase comparator 83.

The phase comparator 83 is connected via a charging current line 87 to a charge pump 88. The phase comparator 83 together with the charge pump 88 forms a phase comparison circuit, whose gain can be adjusted as a function of the charging current produced by the charge pump 88. The strength of the charging current produced by the charge pump 88 is set through the use of a charge pump controller 89 via a control line 90. The charge pump 88 is furthermore connected via a line 91 to a PLL or loop filter 92.

The loop filter 92 emits, via a line 93, a tuning voltage for adjusting or tuning the variable capacitances 32, 49, 50 which are contained in the tuned circuits of the oscillators 29, 45. The tuning voltage which is present on the line 93 is preferably used to tune the varactor diodes 32, 49, 50 provided in the tuned circuits, with the oscillator frequency of the oscillators 29, 45 thus being adjusted, in such a way that the phase or frequency difference on the input lines 82, 86 of the phase comparator 83 is a minimum.

In the case of analog-modulated broadcast television received signals using the PAL (Phase Alternation Line) or SECAM (Sequential Color And Memory) standard, the nominal comparison frequency which needs to be applied to the first input line 82 of the phase comparator 83 is 62.5 kHz. In the case of digitally modulated broadcast received signals, which is an OFDM time-division multiplexing method, the nominal comparison frequency is 166.67 kHz. Depending on whether an analog-modulated broadcast received signal or a digitally modulated broadcast received signal is being received by the receiver illustrated in FIG. 1, a specific frequency division ratio is set in the frequency divider 71, from the memory device 73, as a function of the receiving channel selection signal which is set by the receiving channel selection device 75. The adjustment process is carried out by the frequency of the oscillator signal which is present on the line 70 being divided such that a nominal comparison frequency of 62.5 kHz is present on the line 82 when an analog-modulated received signal is being received, and a nominal comparison frequency of 166.7 kHz is present when a digitally modulated received signal is being received.

The reference oscillator 84 is preferably a quartz crystal. In a preferred embodiment, this quartz crystal emits a reference oscillator signal at a reference frequency of 4 MHz. The frequency divider 81 can be switched by the switching device 79 between a first frequency division ratio of 64 for an analog-modulated received signal, and a second frequency division ratio of 24 for a digitally modulated received signal. In an alternative embodiment, the frequency division ratio for a digitally modulated received signal is 16. When the quartz crystal 84 is emitting a reference oscillator signal at a reference frequency of 4 MHz, the frequency divider 81 divides this sinusoidal reference signal down to a frequency of 62.5 kHz for reception of an analog-modulated received signal. On reception of a digitally modulated received signal, the frequency division ratio of the frequency divider 81 is set to 24, in a first embodiment, so that the reference oscillator frequency of 4 MHz is divided to the nominal comparison frequency of 166.7 kHz. In a preferred embodiment, the frequency division ratio of the frequency divider 81 is 16 for reception of a digitally modulated received signal, so that the nominal comparison frequency is 250 kHz.

As can be seen from FIG. 1, the frequency division ratio of the frequency divider 81 is set by the switching device 79. If reception of a digitally modulated received signal is expected, the switching device 79 switches the frequency divider to the frequency division ratio for digitally modulated received signals, for example to 16 or 24. If reception of an analog-modulated received signal is expected, the switching device 79 is used to switch the frequency division ratio of the frequency divider 81 to 64, so that the nominal comparison frequency of 62.5 kHz specified by the standard is produced on the line 86.

In a further embodiment, the demodulator contains a modulation type identification circuit 95, which automatically identifies whether the received broadcast signal, in particular the received television signal, is analog-modulated or digitally modulated. This modulation type identification circuit 95 preferably controls the switching device 79 illustrated in FIG. 1 in such a way that the corresponding frequency division ratios within the frequency divider 81 are automatically matched to the modulation type of the received broadcast signal.

If the modulation type identification circuit 95 identifies that the received broadcast signal is digitally modulated, the frequency division ratio is preferably set to 24 or 16. Conversely, if the modulation type identification circuit 95 identifies that the received broadcast signal is analog-modulated, the switching device 79 is driven in such a manner that it switches the frequency division ratio of the frequency divider 81 to 64. The phase comparator 83 compares the phase and/or the frequency of the two signals which are present on the lines 82, 86, and tunes the tuned circuits of the oscillators 29, 45 in such a manner that the frequency of the signal which is present on the line 82 matches the nominal comparison frequency which is present on the line 86 as accurately as possible. The phase or frequency difference between the two signals which are present on the lines 82, 86 is preferably zero. This ensures that the phase fluctuation is minimal. If a phase or frequency error from the nominal comparison frequency occurs at the inputs 82, 86 of the phase comparator 83, the varactor diodes 32, 49, 50 are tuned via the tuning line 93 until the phase difference between the two signals which are present on the lines 82, 86 is zero.

The nominal comparison frequency on the line 86 is defined by the respective signal transmission standard. It is 166.7 kHz for DVB-T, in which digital modulation is used, and is 62.5 kHz for the PAL and SECAM transmission standards, which use analog modulation.

The oscillators 29, 45 cause phase noise, which is minimized by the phase locked loop system according to the invention.

FIG. 2 shows a diagram of a typical frequency dependency of the phase noise. In this case, the amplitude of the phase noise (in dB/Hz) is shown with respect to the signal peak as a function of an offset frequency ($f_{OFFSET}$). The offset frequency is the frequency deviation from the resonant or oscillator frequency of the oscillator or the carrier mid-frequency. The curve (a) shows the relationship for the phase noise of a receiver when no phase locked loop is used. In this case, with the offset frequency being illustrated logarithmically, the amplitude of the phase noise falls linearly as the frequency error on the carrier mid-frequency increases. The curve (b) shows the frequency dependency of the phase noise when using a conventional PLL phase locked loop system. As can be seen from FIG. 2, when using a conventional PLL phase locked loop, the phase noise is attenuated to −30 dB with respect to the maximum amplitude of the oscillator, up to a phase locked loop bandwidth or loop bandwidth of $\omega_n$. As is indicated by the curve (c), the phase control system according to the invention attenuates the phase noise to −50 dB up to a loop bandwidth of $\omega_{n2}$. The phase control system according to the invention, as illustrated in FIG. 1, thus results in a considerable reduction in the undesirable phase noise.

The loop bandwidth $\omega_n$ and the attenuation factor $\zeta$ increase in proportion to the square root of the gradient of the oscillator $K_0$, the gain of the phase comparison circuit $K_D$, the reciprocal of the frequency division ratio $1/N_r$ of the second frequency divider 81, and the reciprocal of the frequency division ratio $1/N_{RF}$ of the first frequency divider 71 in accordance with the following formula:

$$\omega_n, \zeta \sim \sqrt{\frac{K_0 \cdot K_D}{N_r \cdot N_{RF}}}$$

The tuning gradient $K_0$ of the oscillators 29, 45 depends on the resonant frequency or the oscillator frequency. The oscillator frequency is for its part governed by the tuning voltage on the tuning line 93 of the loop filter 92. The frequency division ratio $N_r$ of the second frequency divider 81 is 64 for analog-modulated received signals, and is preferably 24 for digitally modulated received signals. These frequency division ratios are applicable at a reference frequency of the quartz crystal 84 and increase in direct proportion if reference oscillators with higher reference frequencies are used. The frequency division ratio for a crystal which emits a reference frequency of 8 MHz is thus 128 for analog-modulated received signals, and is preferably 48 for digitally modulated received signals.

The frequency division ratio of the frequency divider 71 for dividing the frequency of the oscillator signal to a nominal comparison frequency is stored in the memory device 73. If, for example, a receiving channel with a reception frequency of 800 MHz is selected by the channel selection device 75, the oscillator signal which is present on the line 70 is divided by the frequency divider 71 to the nominal comparison frequency of 62.5 kHz for analog-modulated received signals, and is divided to the nominal comparison frequency of 166.7 kHz for digitally modulated received signals. In a corresponding manner, for a receiving channel with a reception frequency of 800 MHz, for example a television transmitter, a frequency division ratio of 12,800 is stored in the memory device 73 for an analog-modulated received signal, and a division ratio of 4800 is stored in the memory device 73 for a digitally modulated received signal. If an operator presses the key associated with this receiving channel in the receiving channel selection device 75 and if the switching device 79 is switched to reception of digitally modulated signals, a frequency division ratio of 4800 is set via the line 72 in the frequency divider 71 from the memory device 73, so that an oscillator signal at a frequency of 800 MHz is divided down to the nominal comparison frequency of 166.7 kHz, corresponding to the standard.

The magnitude of the gain $K_0$ of the phase comparison circuit is dependent on the charging current produced by the charge pump 88. The magnitude of the charging current is adjusted through the use of a charging current control device 89 via the control line 90. In this case, the gain $K_D$ of the phase comparison circuit, which includes the phase comparator 83 and the charge pump 88, is adjusted in such a manner that the phase noise of the receiver is a minimum. As can be seen from FIG. 2, the phase locked loop system according to the invention reduces the phase noise to −50 dB up to a loop bandwidth of $\omega_{n2}$.

In addition to the amplitude of the phase noise, the phase locked loop system according to the invention also optimizes the attenuation factor $\zeta$, and thus the transient response. FIG. 3 shows the frequency dependency of the phase noise when using a conventional phase locked loop as the curve (a), and when using the phase locked loop system according to the invention as the curve (b). As is evident from FIG. 3, the phase locked loop system according to the invention optimizes the attenuation profile, since the amplitude peak in the region of the loop bandwidth frequency $\omega_n$ is leveled out. For predetermined frequency division ratios $N_r$ of the second frequency divider 81, and for predetermined frequency division ratios $N_{RF}$ of the first frequency divider 71, the attenuation factor is set by suitable adjustment of the gain $K_D$ of the phase comparison circuit in such a manner that the phase noise has the frequency dependency represented by the curve (b) in FIG. 3.

FIGS. 4A to 4F show various frequency dependencies of the phase noise in the phase locked loop system according to the invention for various received-carrier mid-frequencies and for different set frequency division ratios $N_r$ of the second frequency divider 81.

Figure 4E:
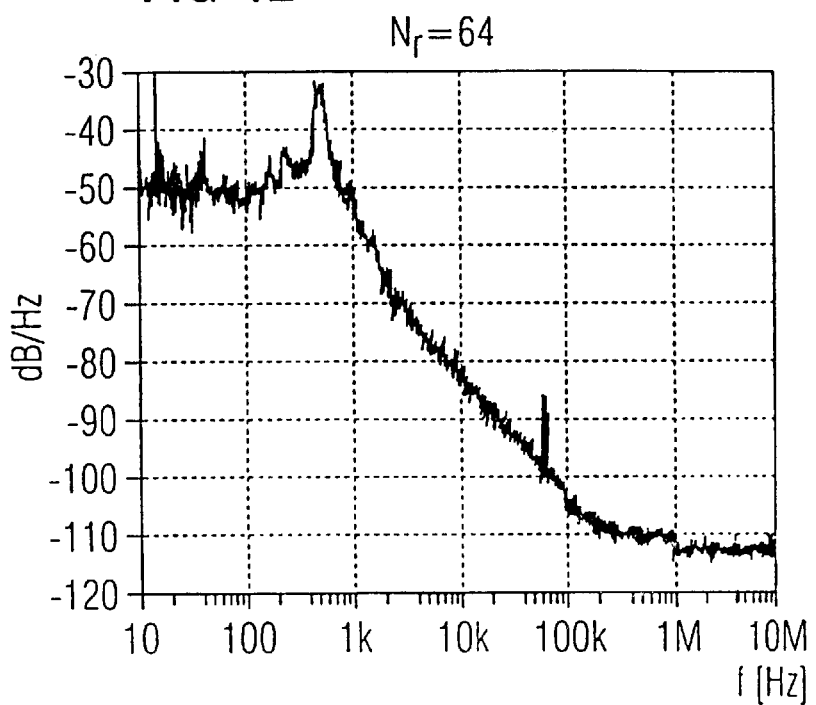

FIGS. 4A, 4B illustrate the profile of the phase noise as a function of the offset frequency for various frequency division ratios $N_r$ for a received-carrier mid-frequency of 414 MHz. If an analog-modulated broadcast signal is being received, the frequency division ratio $N_r$ for division of the reference frequency of 4 MHz is set to 64 so as to produce the nominal comparison frequency of 166.7 kHz. In FIGS. 4A, 4C, 4E, the frequency division ratio of the second frequency divider 81 is set to 64 for reception of analog-modulated broadcast signals.

Figure 4F:
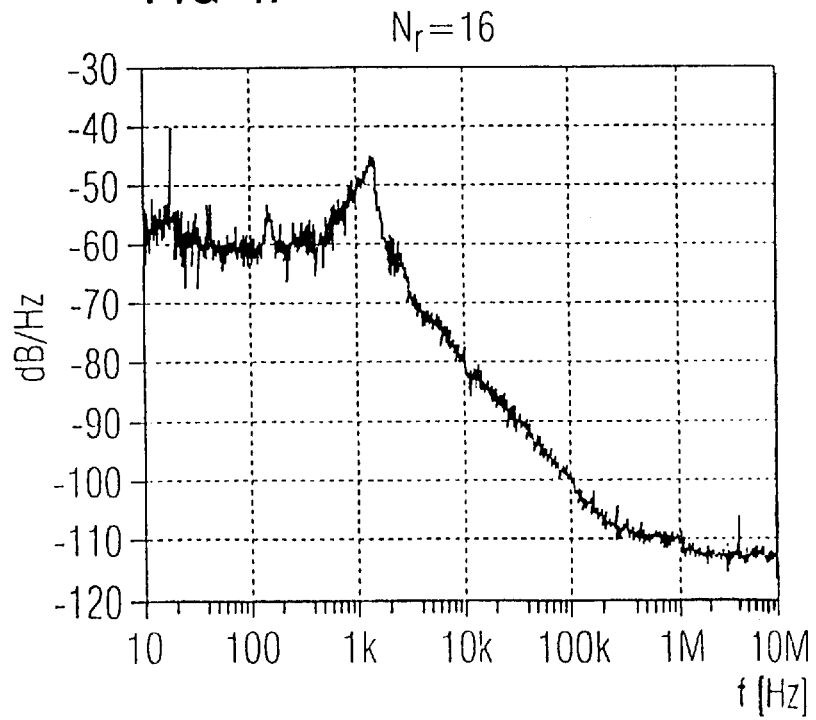

On reception of a digitally modulated broadcast signal, the reference frequency of 4 MHz is divided by a frequency division ratio of 16 in order to produce a nominal comparison frequency of 250 kHz. FIGS. 4B, 4D, 4F show the profile of the phase noise when the second frequency divider 81 is set to a frequency division ratio of 16 for reception of a digitally modulated received signal.

FIGS. 4A, 4B show a comparison of the profile of the phase noise for a carrier mid-frequency of 414 MHz. FIG. 4A shows the profile of the phase noise for a frequency division ratio of 64 for reception of analog-modulated broadcast signals, and FIG. 4B shows the profile of the phase noise when the frequency division ratio is set to 16 for reception of digitally modulated broadcast signals. As can be seen from FIGS. 4A, 4B, the profile of the phase noise is optimum with the phase locked loop system according to the invention. As is evident from FIG. 4A, an attenuation of about 60 dB in the amplitude of the phase noise is achieved up to the loop bandwidth of 1 kHz. The amplitude peak in the region of the PLL loop bandwidth $\omega_n$ of 1 kHz is relatively flattened, and the phase noise then falls virtually linearly, on a linear scale, as the frequency rises, down to a level of −110 dB.

For the carrier mid-frequency of 414 MHz, FIG. 4B shows the situation in which a digitally modulated received signal is being received. The phase noise is attenuated down to about 65 dB up to a PLL loop bandwidth of about 2.5 kHz. In the region of the loop bandwidth frequency of 2.5 kHz there is a relatively flat peak which, on a logarithmic scale, falls linearly, as the frequency rises, to a level of −110 dB.

FIGS. 4C, 4D show the profile of the phase noise for a carrier mid-frequency of 623 MHz for various frequency division ratios. FIG. 4C shows the situation where a frequency division ratio of 64 is set on the second frequency divider 81, for reception of an analog-modulated received signal. FIG. 4D shows the profile of the phase noise when the frequency division ratio is set to 16 for reception of digitally modulated received signals. In FIG. 4C, the loop bandwidth is about 800 Hz while, in contrast, the loop bandwidth in FIG. 4D is about 1.2 kHz.

FIGS. 4E, 4F show the frequency dependency of the phase noise in the phase locked loop system according to the invention for a received-carrier mid-frequency of 847 MHz, with the frequency division ratio in FIG. 4E being 64 for reception of analog-modulated broadcast signals, and that in FIG. 4F being 16 for reception of digitally modulated broadcast signals. The loop bandwidth is about 400 Hz in FIG. 4E, and is 1.1 kHz in FIG. 4F.

In FIGS. 5A to 5D, the phase locked loop system according to the invention has been set in such a manner that the peaks have a flattened profile in the region of the PLL loop bandwidths, in order to optimize the attenuation.

Figure 5A:
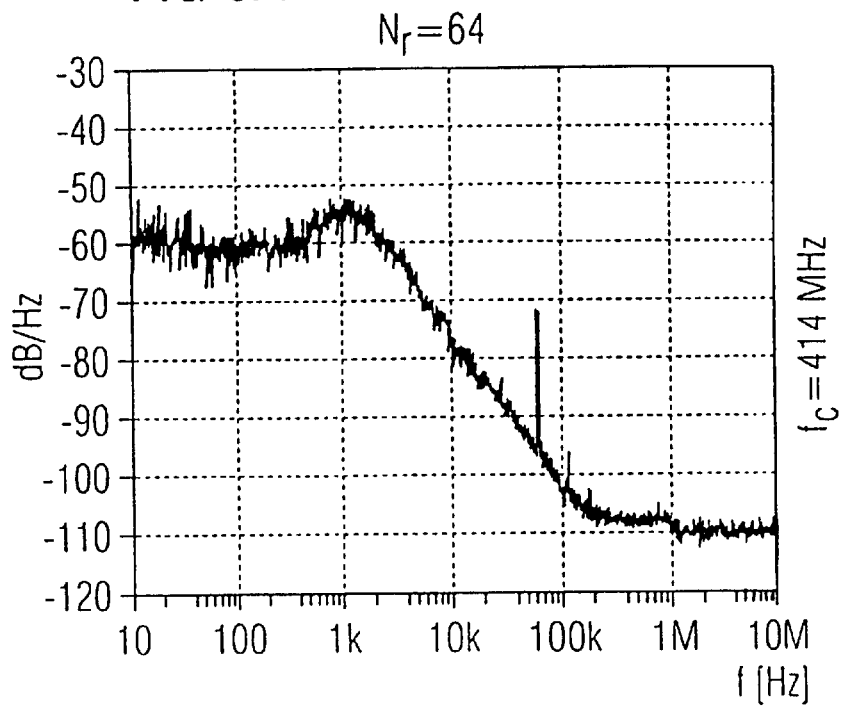
FIGS. 5A to 5D are graphs for illustrating the phase noise as a function of the frequency at different received-carrier mid-frequencies and different frequency division ratios for reception of analog-modulated received signals or digitally modulated received signals.
Figure 5B:
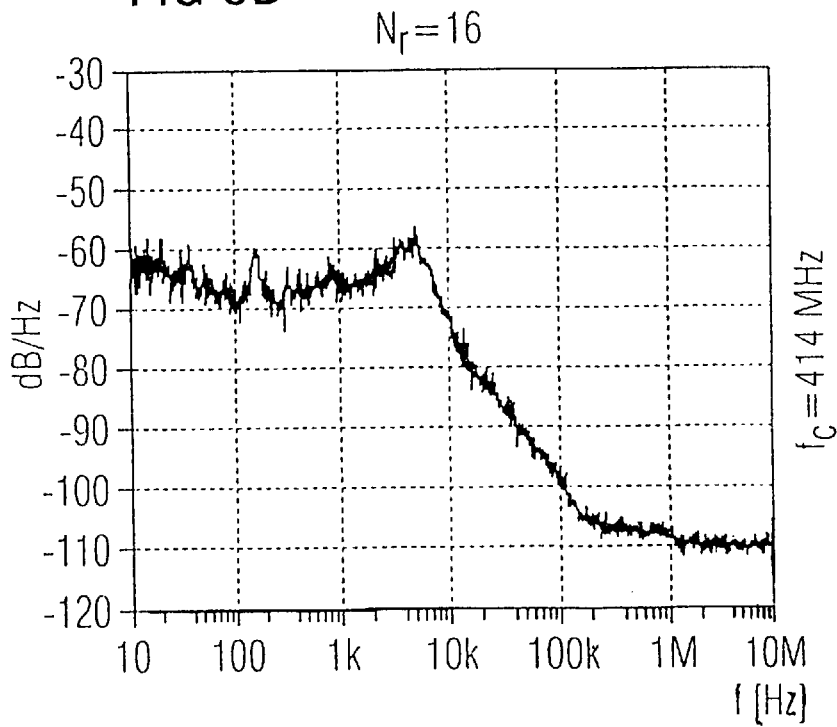
Figure 5C:
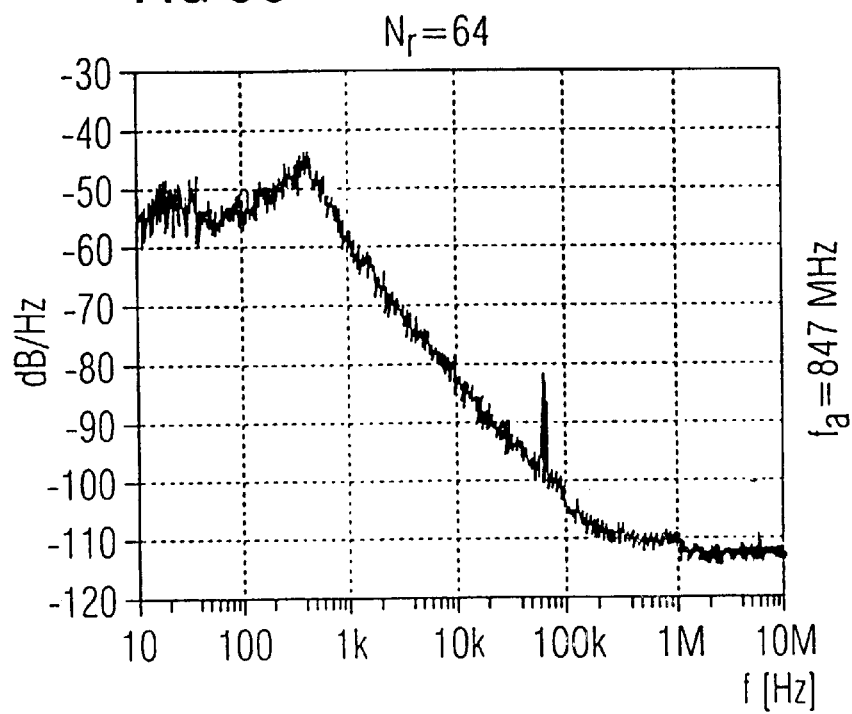
Figure 5D:
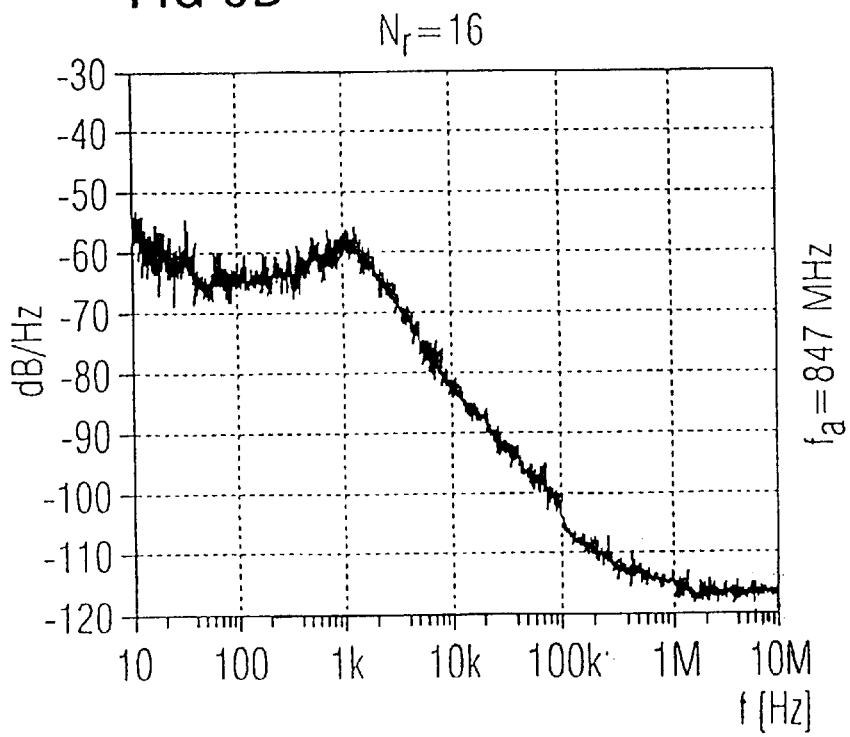

FIGS. 5A, 5C show the situation where the frequency division ratio of the frequency divider 81 is set to 64 for reception of analog-modulated broadcast signals. FIGS. 5B, 5D show the situation where the frequency division ratio of the frequency divider 81 is set to 16 for reception of digitally modulated received signals.

The carrier mid-frequency $f_c$ in FIGS. 5A, 5B is 414 MHz, and the carrier mid-frequency $f_a$ in FIGS. 5C, 5D is 847 MHz.

If, for example, FIG. 4A is compared with FIG. 5A, it can be seen that the peak has a flattened profile in the region of the loop bandwidth of 1 kHz. The same improvement can be seen if FIG. 5B is compared with FIG. 4B. Thus, apart from an absolute increase in the attenuation, the phase locked loop system according to the invention also optimizes the transient response or the attenuation factor. The optimization of the transient response is in this case also evident at higher carrier mid-frequencies, such as 847 MHz, as can be seen by comparing FIGS. 5C, 5D with FIGS. 4E, 4F.

Figure 6A:
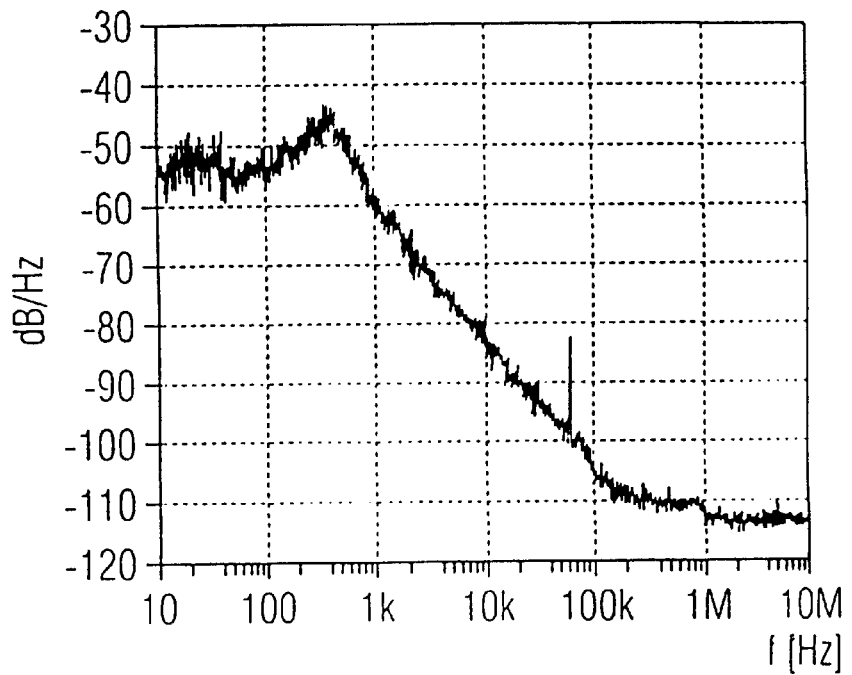
FIGS. 6A and 6B are graphs for illustrating the phase noise as a function of the frequency for different charging currents in the phase comparison circuit according to the invention.
Figure 6B:
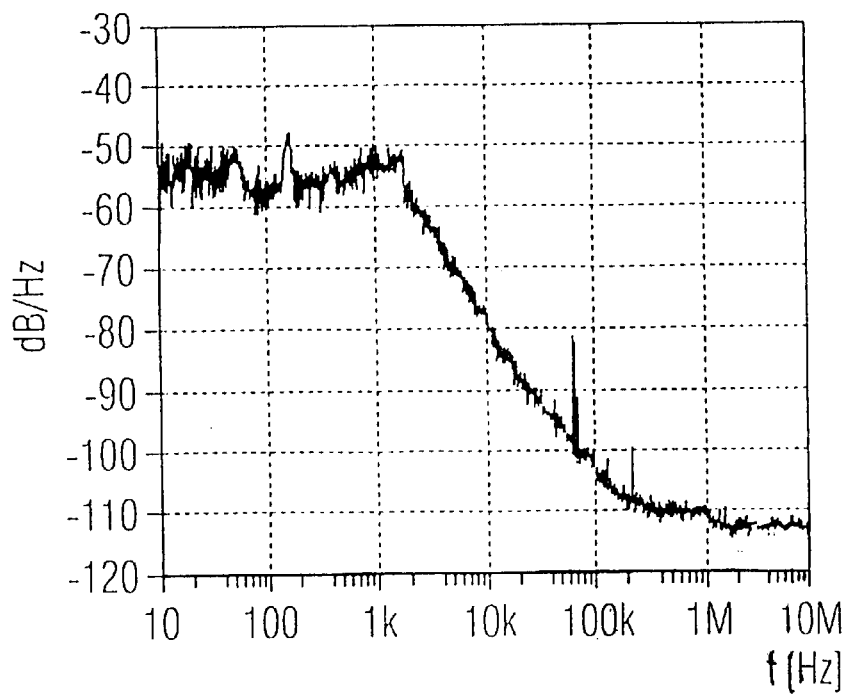

FIG. 6 shows the profile of the phase noise achieved by the phase locked loop system according to the invention as a function of the offset frequency. The frequency division ratio $N_r$ of the second frequency divider 81 is in this case set to 64 for reception of analog-modulated broadcast signals. FIG. 6A shows the situation where the charging current which is produced by the charge pump 88 in the phase comparison circuit is 50 mA. FIG. 6B shows the profile of the phase noise as a function of frequency for the situation where the charging current from the charge pump is 250 mA. As can be seen by comparing FIGS. 6A and 6B, the increase in the charging current on the one hand results in a reduction in the phase noise up to the loop bandwidth, and on the other hand an increase in the loop bandwidth. With the profile illustrated in FIG. 6B, the loop bandwidth is about 1.2 kHz, while the loop bandwidth for the profile illustrated in FIG. 6A is about 400 Hz. Furthermore, the peak in the attenuation profile in the region of the loop bandwidth frequency in FIG. 6B has been clearly leveled out in comparison to the profile in FIG. 6A. The attenuation factor has thus been optimally set in FIG. 6B.

Figure 7:
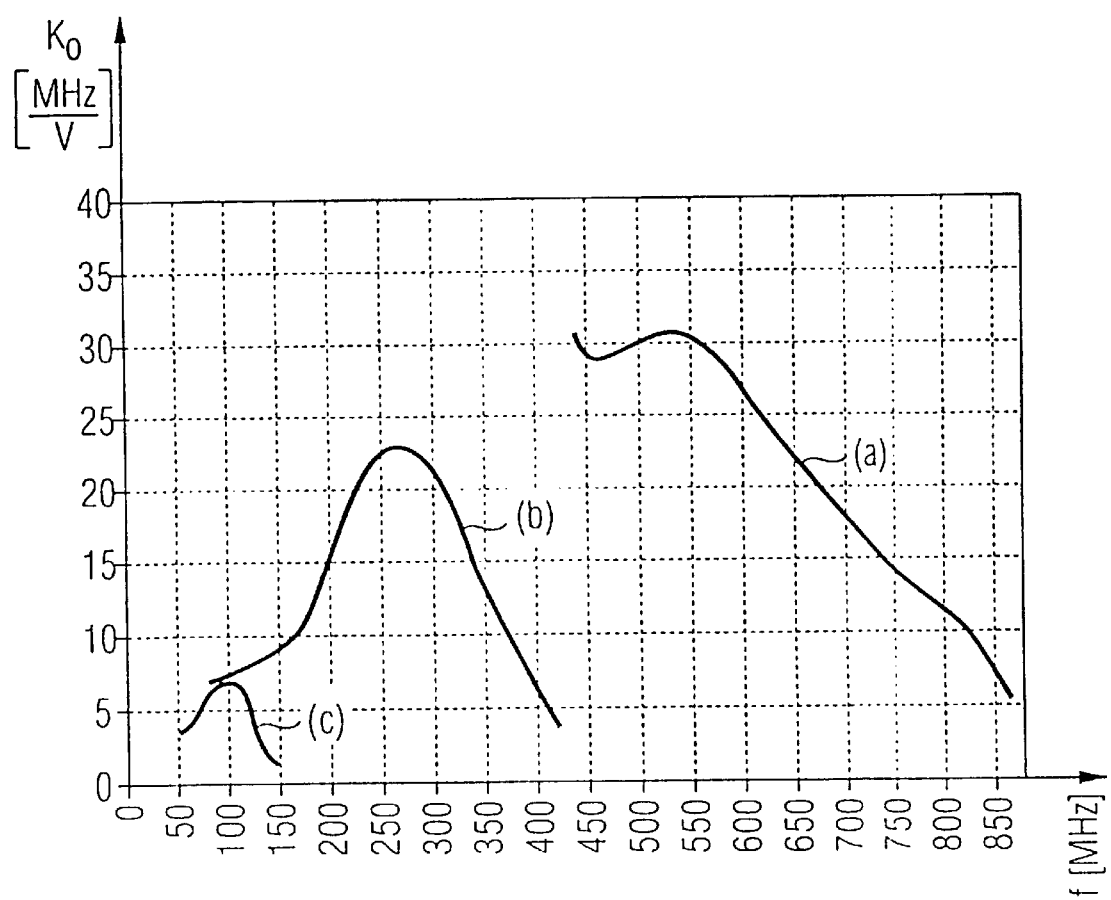
FIG. 7 is a graph for illustrating the tuning gradient of a voltage controlled oscillator as a function of the received-carrier mid-frequency for different reception frequency bands.

FIG. 7 shows the tuning gradient $K_0$ of an oscillator as a function of the reception frequency for various reception frequency bands.

Curve (a) in FIG. 7 shows, by way of example, the profile of the tuning gradient of a typical oscillator as a function of the reception frequency for the UHF reception band.

Curve (b) in FIG. 7 shows the tuning gradient of the same oscillator for the VHFII reception band.

Curve (c) in FIG. 7 shows the tuning gradient of the oscillator for the VHFI reception band.

As can be seen from FIG. 7, the profile of the tuning gradient is different for the various reception frequency bands, with the profile not being linear in large areas. The profile of the tuning gradient $K_0$ of the oscillators is taken into account in the phase locked loop system according to the invention for the adjustment of the gain $K_D$ of the phase comparison circuit in order to optimize the phase noise.

As can be seen from curve profile (a) in FIG. 7, the tuning gradient of the oscillators in the UHF reception band is largely indirectly proportional to the reception frequency. One possible way to compensate for this inverse proportionality is to increase the gain $K_D$ of the phase comparison circuit as a function of the division ratio $N_{RF}$ of the frequency divider 71 and of the tuning gradient $K_0$. This can be achieved by varying the charging current produced by the charge pump 88.

The phase locked loop system according to the invention optimizes the phase noise in a receiver. The receiver can in this case be used for receiving both analog-modulated signals and digitally modulated signals. The phase locked loop system according to the invention is particularly suitable for receivers which are used for receiving digital television signals. These digital television signals may be transmitted, for example, in digital form terrestrially, using an OFDM multiplexing method, in a digital DVB television distribution service.

By switching between different frequency division ratios for analog-modulated broadcast signals and digitally modulated broadcast signals, it is possible to supplement the circuitry of already existing circuit modules which were used for the previous analog broadcast signals such that they can also be used for reception of digitally modulated broadcast signals, in particular digitally modulated television received signals.

The phase noise of the receiver is considerably reduced by the phase locked loop system according to the invention, and the error rate in decoding of the signal is thus decreased.

We claim:

1. A phase locked loop system, comprising:
    at least one voltage controlled oscillator for producing an oscillator signal having an oscillator signal frequency, the oscillator signal being provided for tuning a reception frequency;
    a first frequency divider, coupled to said at least one voltage controlled oscillator, for dividing the oscillator signal frequency to a nominal comparison frequency as a function of a receiving channel selection signal;
    a reference oscillator for generating a reference oscillator signal having a given reference frequency;
    a second frequency divider, coupled to said reference oscillator, for dividing the given reference frequency as a function of a reception mode switching signal;
    a phase comparison circuit, coupled to said first frequency divider and to said second frequency divider, for comparing signals supplied by said first frequency divider and said second frequency divider in order to produce a tuning voltage for said at least one voltage-controlled oscillator, said phase comparison circuit having an adjustable gain for optimizing a phase noise;
    a multiplication device, coupled to said at least one voltage controlled oscillator, for multiplying a received signal by the oscillator signal in order to produce an intermediate frequency signal; and
    a detection circuit provided downstream from said multiplication device, said detection circuit detecting the phase noise on the intermediate frequency signal and generating a control signal, the adjustable gain of said phase comparison circuit being adjustable as a function of the control signal.

2. The phase locked loop system according to claim 1, wherein:
    said phase comparison circuit includes a phase comparator and a charge pump; and
    said charge pump produces a charging current for adjusting the adjustable gain of said phase comparison circuit.

3. The phase locked loop system according to claim 2, including:
    a controller, connected to said charge pump, for providing a control signal; and
    said charge pump setting the charging current as a function of the control signal provided by said controller.

4. The phase locked loop system according to claim 1, including:
    a memory device, coupled to said first frequency divider, for storing a plurality of frequency division ratios for a plurality of receiving channels, such that said memory device stores for each of the receiving channels a respective one of the frequency division ratios for receiving an analog-modulated received signal and a further respective one of the frequency division ratios for receiving a digitally modulated received signal; and
    said first frequency divider being configured to switch between the plurality of frequency division ratios as a function of the receiving channel selection signal.

5. The phase locked loop system according to claim 1, including:
    a switching device connected to said second frequency divider; and
    said second frequency divider selectively operating with a first frequency division ratio for an analog-modulated received signal and operating with a second frequency division ratio for a digitally modulated received signal, and said switching device switching said second frequency divider between the first frequency division ratio and the second frequency division ratio.

6. The phase locked loop system according to claim 1, wherein said reference oscillator is a quartz crystal.

7. The phase locked loop system according to claim 1, including a receiving channel selection device, connected to said first frequency divider, for generating the receiving channel selection signal.

8. The phase locked loop system according to claim 1, including an automatic gain control circuit, provided downstream from said multiplication device, for amplifying the received signal as a function of an amplitude of the intermediate frequency signal.

9. The phase locked loop system according to claim 1, including a loop filter, coupled to said phase comparison circuit, for filtering the tuning voltage produced by said phase comparison circuit.

10. The phase locked loop system according to claim 1, including:
    at least one signal amplifier provided downstream of said multiplication device; and
    a SAW bandpass filter provided downstream of said multiplication device.

11. The phase locked loop system according to claim 1, wherein said first frequency divider divides the oscillator signal frequency to the nominal comparison frequency such that the nominal comparison frequency is 62.5 kHz for analog-modulated received signals, and such that the nominal comparison frequency is a frequency selected from the group consisting of 166.7 kHz and 250 kHz for digitally modulated received signals.

12. The phase locked loop system according to claim 1, wherein said reference oscillator generates the reference oscillator signal such that the given reference frequency is 4 MHz.

13. The phase locked loop system according to claim 1, wherein said second frequency divider is switchable between a first frequency division ratio of 64 for an analog-modulated received signal and a second frequency division ratio of 24 for a digitally modulated received signal.

14. The phase locked loop system according to claim 1, wherein said second frequency divider is switchable between a first frequency division ratio of 64 for an analog-modulated received signal and a second frequency division ratio of 16 for a digitally modulated received signal.

15. The phase locked loop system according to claim 1, including an identification circuit for identifying a modulation type, said identification circuit identifying whether the received signal is an analog-modulated signal or a digitally modulated signal.

16. The phase locked loop system according to claim 1, including an identification circuit for identifying a modulation type, said identification circuit identifying whether the received signal is an analog-modulated signal or a digitally modulated signal, and said identification circuit setting frequency division ratios for said first frequency divider and said second frequency divider as a function of whether the received signal is analog-modulated or digitally modulated.

17. In combination with a receiver having a reception frequency and being configured for receiving digitally modulated received signals and analog-modulated received signals, a phase locked loop system, comprising:

- at least one voltage controlled oscillator for producing an oscillator signal having an oscillator signal frequency, the oscillator signal being provided for tuning the reception frequency;
- a first frequency divider, coupled to said at least one voltage controlled oscillator, for dividing the oscillator signal frequency to a nominal comparison frequency as a function of a receiving channel selection signal;
- a reference oscillator for generating a reference oscillator signal having a given reference frequency;
- a second frequency divider, coupled to said reference oscillator, for dividing the given reference frequency as a function of a reception mode switching signal;
- a phase comparison circuit, coupled to said first frequency divider and to said second frequency divider, for comparing signals supplied by said first frequency divider and said second frequency divider in order to produce a tuning voltage for said at least one voltage-controlled oscillator, said phase comparison circuit having an adjustable gain for optimizing a phase noise;
- a multiplication device, coupled to said at least one voltage controlled oscillator, for multiplying a received signal by the oscillator signal in order to produce an intermediate frequency signal; and
- a detection circuit provided downstream from said multiplication device, said detection circuit detecting the phase noise on the intermediate frequency signal and generating a control signal, the adjustable gain of said phase comparison circuit being adjustable as a function of the control signal.

* * * * *